United States Patent
Taniguchi et al.

(10) Patent No.: US 9,437,736 B2
(45) Date of Patent: Sep. 6, 2016

(54) NON-VOLATILE SEMICONDUCTOR MEMORY DEVICE

(71) Applicant: Floadia Corporation, Tokyo (JP)

(72) Inventors: Yasuhiro Taniguchi, Tokyo (JP); Kosuke Okuyama, Tokyo (JP)

(73) Assignee: Floadia Corporation, Tokyo (JP)

( * ) Notice: Subject to any disclaimer, the term of this patent is extended or adjusted under 35 U.S.C. 154(b) by 0 days.

(21) Appl. No.: 14/215,536

(22) Filed: Mar. 17, 2014

(65) Prior Publication Data
US 2014/0284677 A1    Sep. 25, 2014

(30) Foreign Application Priority Data

Mar. 19, 2013   (JP) ................................. 2013-057328

(51) Int. Cl.
| | | |
|---|---|---|
| H01L 29/788 | (2006.01) | |
| H01L 29/78 | (2006.01) | |
| H01L 29/66 | (2006.01) | |
| H01L 29/423 | (2006.01) | |
| H01L 29/792 | (2006.01) | |
| G11C 16/04 | (2006.01) | |

(52) U.S. Cl.
CPC ....... *H01L 29/7841* (2013.01); *G11C 16/0466* (2013.01); *H01L 29/4234* (2013.01); *H01L 29/66659* (2013.01); *H01L 29/788* (2013.01); *H01L 29/792* (2013.01)

(58) Field of Classification Search
CPC ............... H01L 29/788; H01L 29/792; H01L 29/66575; H01L 29/66659

USPC .......................... 257/314–316, 321, 322, 324
See application file for complete search history.

(56) References Cited

U.S. PATENT DOCUMENTS

| | | | | |
|---|---|---|---|---|
| 2001/0013628 A1* | 8/2001 | Tyagi | ................. | H01L 29/6659 257/408 |
| 2004/0232475 A1* | 11/2004 | Kataoka | ............ | H01L 21/28282 257/315 |
| 2005/0194633 A1* | 9/2005 | Mori | ............................. | 257/324 |
| 2013/0015516 A1* | 1/2013 | Kim et al. | .................... | 257/316 |
| 2013/0200445 A1* | 8/2013 | Lee | ......................... | H01L 29/78 257/288 |

FOREIGN PATENT DOCUMENTS

JP          2007-142398 A       6/2007

* cited by examiner

*Primary Examiner* — Matthew E Warren
(74) *Attorney, Agent, or Firm* — Fox Rothschild LLP; Robert J. Sacco; Carol E. Thorstad-Forsyth

(57) ABSTRACT

In a non-volatile semiconductor memory device, it is only necessary that, at the time of data writing, a voltage drop is caused in a high resistance region. Therefore, the value of voltage applied to a gate electrode can be reduced as compared with a conventional device. In correspondence with the reduction in the value of applied voltage, it is possible to reduce the film thickness of a gate insulating film of memory transistors, and further the film thickness of the gate insulating film of a peripheral transistor for controlling the memory transistors. As a result, the circuit configuration of the non-volatile semiconductor memory device can be reduced in size as compared with the conventional device.

6 Claims, 5 Drawing Sheets

NON-VOLATILE SEMICONDUCTOR MEMORY DEVICE

BACKGROUND OF THE INVENTION

1. Field of the Invention

The present invention relates to a non-volatile semiconductor memory device, and is suitably applied to, for example, a non-volatile semiconductor memory device including a memory transistor in which data can be written by injecting carriers into a carrier storage region formed in a side wall of a gate electrode side portion.

2. Description of the Related Art

In recent years, the study of non-volatile semiconductor memory devices, which can be easily manufactured by a standard CMOS (Complementary Metal Oxide Semiconductor) process, has been actively conducted. As such non-volatile semiconductor memory devices, there are known an MTP (Multiple Time PROM) in which data can be written a plurality of times, and an OTP (One Time PROM) in which data can be written only once.

As the non-volatile semiconductor memory device of MTP, for example, a non-volatile semiconductor memory device as described in Japanese Patent Laid-Open No. 2007-142398 (hereinafter, JP2007-142398A) is known. The non-volatile semiconductor memory device described in JP2007-142398A includes a carrier storage region in a side wall, and is configured such that data can be written by injecting carriers into the carrier storage region and such that data can be erased by extracting carriers from the carrier storage region.

However, although, in JP2007-142398A, it is disclosed that data can be repeatedly written and erased, it is difficult to actually extract carriers once injected into the carrier storage region in the side wall. Therefore, it is practical that the non-volatile semiconductor memory device described in JP2007-142398A is used as an OTP in which data can be written only once.

Further, in the non-volatile semiconductor memory device described in JP2007-142398A, a voltage of 5 to 7 [V] needs to be applied to a gate electrode, and the like, in order to inject carriers into the carrier storage region in the side wall, and hence the film thickness of the gate insulating film needs to be correspondingly increased, which results in a problem that the cell size is increased. Further, in the non-volatile semiconductor memory device described in JP2007-142398A, since such the high voltage of 5 to 7 [V] needs to be controlled for each bit line, a peripheral transistor for controlling the memory transistor also needs to be formed as a high-voltage element, and hence the gate insulating film of the peripheral transistor also needs to be formed to have a larger film thickness so as to withstand the high voltage of 5 to 7 [V]. This also results in a problem that the size of the entire circuit configuration is increased as compared with a non-volatile semiconductor memory device of an OTP, which can be configured only by a core MOS (for example, 1.5 [V]-MOS).

Accordingly, the present invention has been made in view of the above described circumstances, and an object of the present invention is to propose a non-volatile semiconductor memory device which can reduce the size of the circuit configuration as compared with the conventional device.

SUMMARY OF THE INVENTION

In order to solve the above described problems, according to an aspect of the present invention, there is provided a non-volatile semiconductor memory device including one or more memory transistors each having a single layer gate structure in which a gate electrode is provided on a substrate via a gate insulating film, the non-volatile semiconductor memory device being featured in that the memory transistor includes a source region and a drain region each formed in a surface of the substrate, and a carrier storage region provided on the substrate and arranged between the gate electrode and the drain region, and in that, in a region in the surface of the substrate, the region being in contact with the drain region and facing the carrier storage region, a high resistance region having a resistance value higher than a resistance value of a region between a channel region under the gate electrode and the source region is formed.

According to the present invention, at the time of data writing, a voltage drop is caused only in the high resistance region, so that carriers in the drain region can be injected into the carrier storage region via the high resistance region by source side injection using a strong electric field generated in the high resistance region. Therefore, in the non-volatile semiconductor memory device according to the present invention, it is only necessary that the voltage drop is caused in the high resistance region at the time of data writing. Thereby, the values of voltages applied to the bit line and the gate electrode can be reduced as compared with the conventional device, and hence the film thickness of the gate insulating film of the memory transistor, and the film thickness of the gate insulating film of the peripheral transistor for controlling the memory transistor can also be reduced in correspondence with the reduction of the applied voltage values, as a result of which the circuit configuration can be reduced in size as compared with the conventional device.

DETAILED DESCRIPTION OF THE PREFERRED EMBODIMENTS

In the following, embodiments according to the present invention will be described with reference to the accompanying drawings.

(1) Circuit Configuration of Non-Volatile Semiconductor Memory Device

Figure 1:
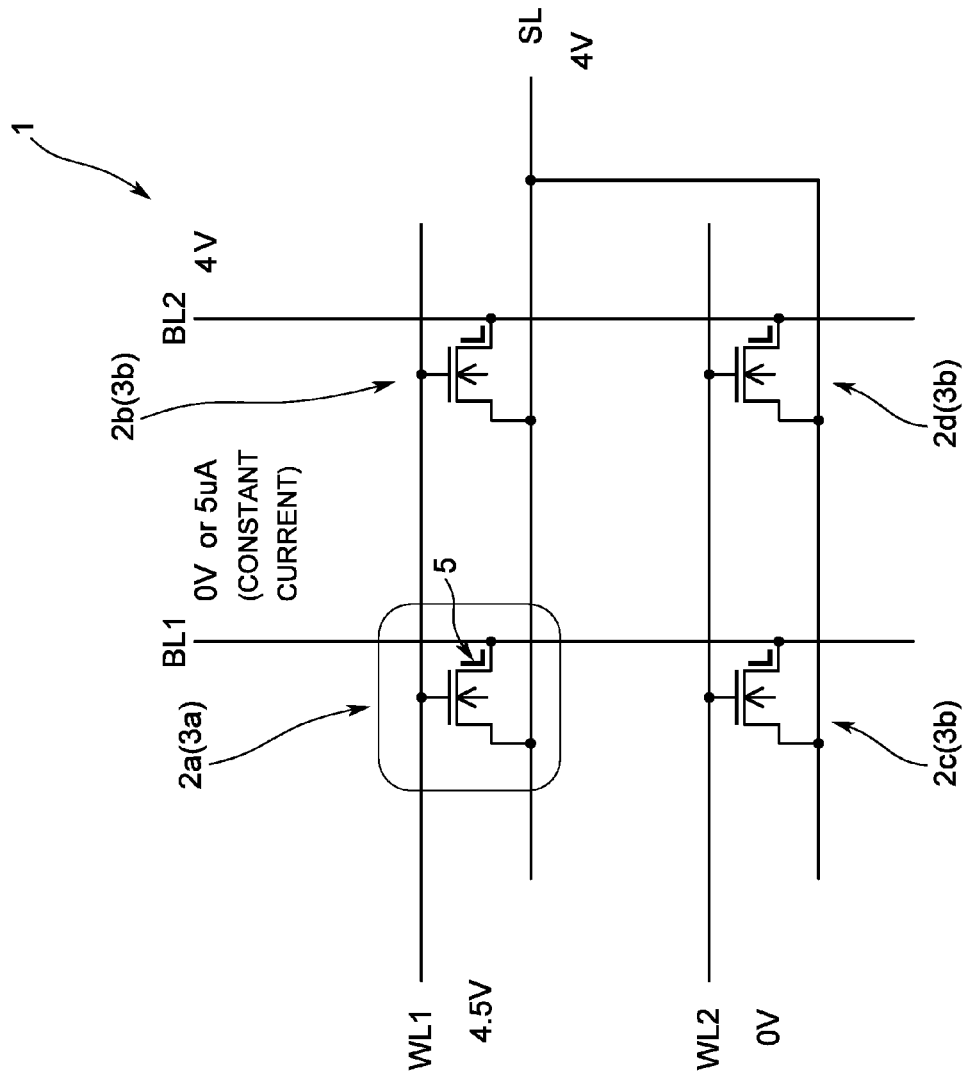
FIG. 1 is a circuit diagram showing a circuit configuration of a non-volatile semiconductor memory device according to an embodiment of the present invention, and showing voltage values of respective portions of the non-volatile semiconductor memory device at the time of data writing.

In FIG. 1, reference numeral 1 denotes a non-volatile semiconductor memory device in which four memory transistors 2a, 2b, 2c and 2d, each having, for example, an N-type MOS (Metal Oxide Semiconductor) structure, are arranged in two rows and two columns, and which is set so that data can be written by source side injection into a memory transistor, for example, the memory transistor 2a, arbitrarily selected from these memory transistors 2a, 2b, 2c and 2d. Here, the non-volatile semiconductor memory device 1 is an OTP in which data can be written only once into each of the memory transistors 2a, 2b, 2c and 2d, and is configured such that data once written into, for example, the memory transistor 2a cannot be erased.

In this case, in the non-volatile semiconductor memory device 1, two bit lines BL1 and BL2, and two word lines WL1 and WL2 are provided, and the memory transistors 2a, 2b, 2c and 2d are respectively arranged at positions where the bit lines BL1 and BL2 cross the word lines WL1 and WL2. Further, the non-volatile semiconductor memory device 1 is configured such that one source line SL is connected to the memory transistors 2a, 2b, 2c and 2d, and such that a predetermined voltage can be uniformly applied to each of the memory transistors 2a, 2b, 2c, and 2d by the source line SL.

In the case of the present embodiment, the memory transistors 2a, 2b, 2c and 2d all have the same configuration. Therefore, in order to avoid repetitive description, in the following, the description is made by focusing on the memory transistor 2a. In the memory transistor 2a, the word line WL1, which is also connected to the other memory transistor 2b arranged in one direction of the memory transistor 2a, is connected to the gate electrode of the memory transistor 2a, and the bit line BL1, which is connected to the other memory transistor 2c arranged in the other direction of the memory transistor 2a, is connected to one end of the memory transistor 2a, and the source line SL is connected to the other end of the memory transistor 2a.

Further, the memory transistor 2a includes a carrier storage region 5, into which charges (electrons) can be injected, and which is provided between the gate electrode connected to the word line WL1, and the one end connected to the bit line BL1, and is configured such that voltages respectively applied to the word line WL1, the bit line BL1, and the source line SL are adjusted so that data can be written by injecting charges into the carrier storage region 5 by source side injection.

The non-volatile semiconductor memory device 1 is configured such that a peripheral transistor (not shown) having an N-type MOS structure is connected to each of the memory transistor 2a, 2b, 2c and 2d arranged in a matrix form, and such that the memory transistors 2a, 2b, 2c and 2d can be controlled by the peripheral transistor.

Figure 2:
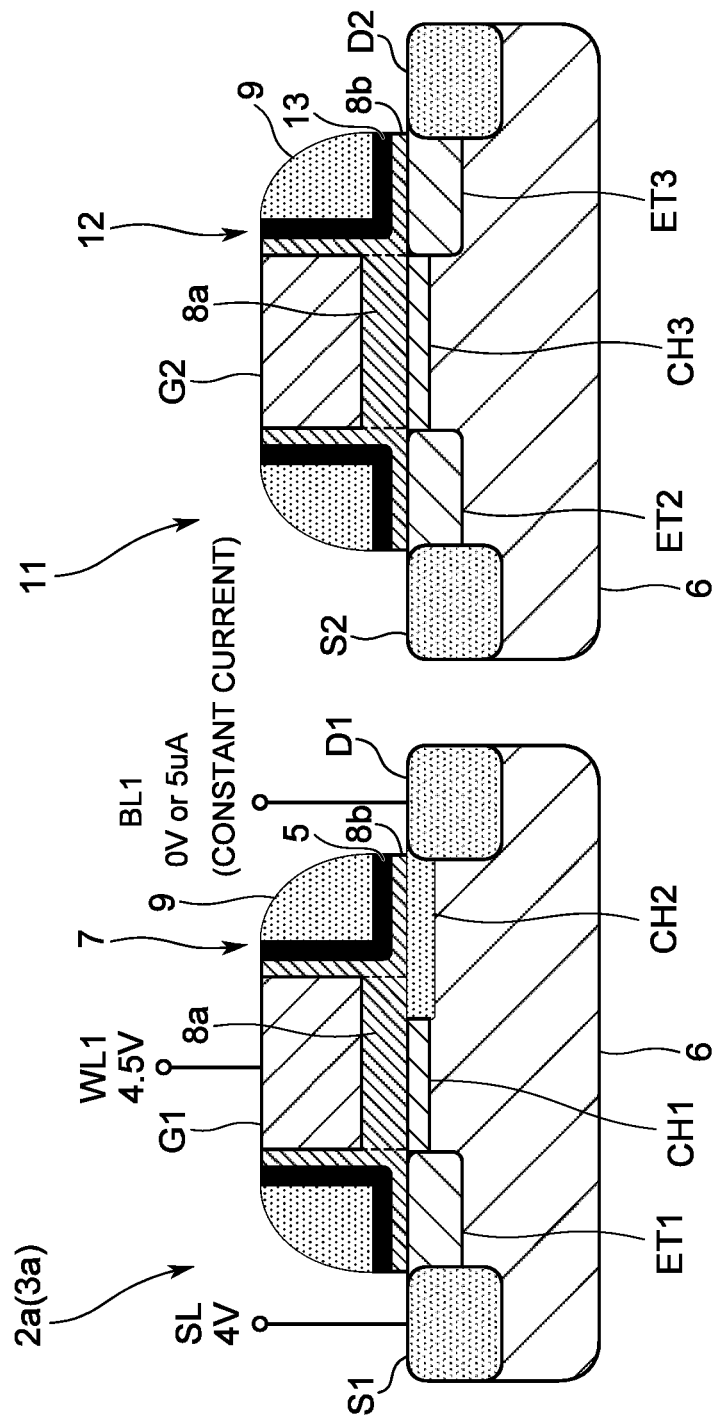
FIG. 2 is a sectional side view showing cross-sectional structures of a memory transistor and a peripheral transistor.

Here, FIG. 2 is a cross-sectional view showing side cross-sectional structures of the memory transistor 2 shown in FIG. 1, and a peripheral transistor 11. In the memory transistor 2a in which a source region S1 and a drain region D1 are formed in the surface of a silicon substrate 6 at an interval therebetween, the bit line BL1 is connected to the drain region D1 provided at the one end, and the source line SL is connected to the source region S1 provided at the other end.

Further, in the surface of the substrate 6 between the source region S1 and the drain region D1, an extension region ET1 is formed so as to be in contact with the side surface of the source region S1, and a channel region CH1 and a high resistance region CH2 are formed between the extension region ET1 and the drain region D1.

The memory transistor 2a is configured by a single layer gate structure in which a gate electrode G1 is formed between the source region S1 and the drain region D1 via a gate insulating film 8a, and is configured such that the word line WL1 is connected to the gate electrode G1. Further, in the memory transistor 2a, a side wall 7 is formed at each of both side portions of the gate electrode G1. The high resistance region CH2 is arranged in the surface of the substrate 6 so as to face one of the side walls 7, and the extension region ET1 is arranged in the surface of the substrate 6 so as to face the other of the side walls 7.

In practice, the side wall 7 is configured by an insulating layer 8b made of silicon oxide, the carrier storage region 5 made of a nitride film or the like, and capable of accumulating charges therein, and an insulating layer 9 made of silicon oxide, and is configured such that the carrier storage region 5 and the insulating layer 9 can be arranged in order on the insulating layer 8b formed along the surfaces of the gate electrode G1 and the substrate 6. In the side wall 7 configured in this way, at the time of data writing, charges in the drain region D1 can be injected into the carrier storage region 5 via the high resistance region CH2 by source side injection.

In practice, in the case of the present embodiment, the high resistance region CH2 is formed in a region in the surface of the substrate 6, the region extending from the drain region D1 to a part of the region under the gate electrode G1 through the region under the carrier storage region 5. Here, the present invention is featured in that, in the memory transistor 2a, the impurity concentration of the high resistance region CH2 is selected to be lower than the impurity concentration of the extension region ET1, so that the high resistance region CH2 has a resistance value higher than the resistance value of the extension region ET1. For example, in the case of the present embodiment, it is preferred that the dope amount of impurities in the high resistance region CH2 is $1E18/cm^3$ or less.

The memory transistor 2a having the above-described structure is configured such that, when at the time of the data writing described below, a large potential difference is caused between the source line SL and the bit line BL1, a largest potential drop is caused in the high resistance region CH2 having the high resistance value, and thereby a high electric field is generated in the high resistance region CH2 so that charges in the drain region D1 can be injected into the carrier storage region 5 via the high resistance region CH2 by source side injection.

Next, a configuration of the peripheral transistor 11, which controls each of the memory transistors 2a, 2b, 2c and 2d, will be described below. The peripheral transistor 11 includes an N-type MOS structure electrically connected to the memory transistors 2a, 2b, 2c and 2d. In the peripheral transistor 11, a source region S2 and a drain region D2 are formed at an interval therebetween in the silicon substrate 6. In the surface of the substrate 6 between the source region S2 and the drain region D2, extension regions ET2 and ET3 are formed so as to be respectively in contact with the side surfaces of the source region S2 and the drain region D2, and a gate electrode G2 is formed, via the gate insulating film 8a, on a channel region CH3 provided between the extension regions ET2 and ET3.

Further, on the upper surface of the extension regions ET2 and ET3, a side wall 12 is formed so as to cover both side portions of the gate electrode G2. It should be noted that the side wall 12 is configured by the insulating layer 8b made of silicon oxide, a nitride film layer 13, and the insulating layer 9 made of silicon oxide, and is configured such that the nitride film layer 13 and the insulating layer 9 can be arranged in order on the insulating layer 8b formed along the surfaces of the gate electrode G2 and the substrate 6.

In the case of the present embodiment, the peripheral transistor 11, in which the film thickness of the gate insulating film 8a is selected to be 8 [nm] or less, has a core MOS structure generally used in a nonvolatile memory and having a small thickness of the gate insulating film. In the non-volatile semiconductor memory device 1 according to the present invention, the values of voltages respectively applied to the memory transistors 2a, 2b, 2c and 2d can be reduced at the time of data writing and data reading (described below), and hence it is not necessary that the peripheral transistor 11 electrically connected to the memory transistors 2a, 2b, 2c and 2d is formed as a high-voltage element in which the thickness of the gate insulating film is set to, for example, 12 [nm]. Therefore, the gate insulating film 8a of the peripheral transistor 11 can also be formed to be thin, and hence the entire circuit configuration can be reduced in size in correspondence with that such high-voltage element is not used.

It should be noted that, in the case where a plurality of the peripheral transistors 11 for controlling the memory transistors 2a, 2b, 2c and 2d are provided, and where the film thicknesses of the gate insulating films 8a of the peripheral transistors 11 are different from each other, the film thickness of the gate insulating film 8a of the memory transistors 2a, 2b, 2c and 2d can also be selected to be the same as the smallest film thickness among the film thicknesses of the gate insulating films 8a of the peripheral transistors 11.

Incidentally, the memory transistors 2a, 2b, 2c and 2d, and the peripheral transistor 11 can be manufactured by performing each of general CMOS manufacturing processes, such as a film forming process, a photoresist application process, an exposure and development process, an etching process, an impurity doping process, and a photoresist removal process, and hence the description of the manufacturing method of the memory transistors 2a, 2b, 2c and 2d, and the peripheral transistor 11 is omitted here.

(2) Data Writing Operation (2-1) Data Writing Operation Based on Basic Voltage Setting Next, the data writing operation in the non-volatile semiconductor memory device 1 according to an embodiment of the present invention will be described below. FIG. 1 shows voltage values at respective portions at the time of writing data only into the memory transistor 2a of the first row and first column among the plurality of memory transistors 2a, 2b, 2c and 2d. It should be noted that, here, the memory transistor 2a, into which data is written, is referred to as a selected memory 3a, and the memory transistors 2b, 2c and 2d, into which data is not written, are referred to as non-selected memories 3b.

In this case, as shown in FIG. 1, in the non-volatile semiconductor memory device 1, a write source voltage of about 1.5 V to 4 V (for example, 4 [V] in FIG. 1) is applied to the source region S1 of the memory transistors 2a, 2b, 2c and 2d via the source line SL. Further, a write gate voltage equal to or more than the write source voltage of the source line SL, that is, a voltage of about 1.5 to 4.5 [V] (for example, 4.5 [V] in FIG. 1) is applied to the word line WL1 connected to the selected memory 3a (when the write source voltage of the source line SL is set as SLV, and when the write gate voltage of the word line WL1 is set as WL1V, SLV≤WL1V), and a write voltage of 0 [V] is applied to the bit line BL1 connected to the selected memory 3a. It should be noted that, when the voltage applied to the drain region D1 of the selected memory 3a is controlled by current, constant current of, for example, 5 [µA] can be supplied to the bit line BL1 connected to the selected memory 3a.

In this way, as shown in FIG. 2, when the write source voltage of 4 [V] is applied to the source region S1 via the source line SL, and when the write gate voltage of 4.5 [V] is applied to the gate electrode G1 via the word line WL1, the selected memory 3a is set in an on-state in which current can flow through the channel region CH1 and the high resistance region CH2. In the selected memory 3a, when the write voltage of 0 [V] is applied via the bit line BL1, or when the constant current of 5 [µA] is supplied via the bit line BL1, a large voltage difference is caused in the high resistance region CH2 provided between the channel region CH1 and the drain region D1, so that a strong electric field is generated in the high resistance region CH2.

Thereby, in the selected memory 3a, charges (carriers) in the drain region D1 is accelerated in the high resistance region CH2 by the strong electric field generated in the high resistance region CH2, so that a part of the accelerated charges and secondary charges generated by the accelerated charges can be injected into the carrier storage region 5 in the side wall 7. As a result, charges are accumulated in the carrier storage region 5, so that the selected memory 3a can be set in a state in which data is written.

In this way, in the selected memory 3a, a strong electric field is generated in the high resistance region CH2 at the time of data writing, and charges can be injected into the carrier storage region 5 by the strong electric field, so that data writing by source side injection can be realized with a single-layer gate structure.

Further, the high resistance region CH2, in which the impurity concentration is set to be low, has a high resistance value. Therefore, although in the high resistance region CH2, a large voltage drop is caused at the time of data writing, a low voltage of 1.5 to 4.5 [V] can be selected as the write gate voltage, and hence it is not necessary that a high-voltage element is used as the peripheral transistor 11 for controlling the selected memory 3a. As a result, in the peripheral transistor 11, the gate insulating film 8a can be formed to have a film thickness of, for example, 8 [nm] or less, and hence it is not necessary that a high-voltage element, which is exclusively used for control of the memory cell, is used as the peripheral transistor 11. Therefore, a general element, which is used for an operation other than the memory operation, can be used as the peripheral transistor 11, and for example, in a case where input/output voltages are set to 3.3 [V], an input/output MOS, which is configured by a gate insulating film having a thickness of about 7 [nm] to 8 [nm], can be used as it is for controlling the input/output voltages.

Incidentally, at this time, in the non-volatile semiconductor memory device 1 as shown in FIG. 1, a write inhibit voltage ranging from a half of the voltage of the source line SL to a voltage substantially equal to the voltage of the source line SL (for example, 4 [V] in FIG. 1) is applied to the bit line BL2 connected to the non-selected memory 3b (memory transistor 2b) to which the write gate voltage of, for example, 4.5 [V] is applied via the word line WL1 (when the write inhibit voltage is set as BL2V, SLV/2≤BL2V≤SLV).

Thereby, in the memory transistor 2b which is the non-selected memory 3b sharing the word line WL1 with the selected memory 3a, the electric field generated in the high resistance region CH2 becomes a half or less of the electric field applied in the selected memory 3a, and hence generated amount of charges (carriers) is significantly reduced, so that charges are not injected into the carrier storage region 5.

On the other hand, a write inhibit gate voltage of 0 [V] to 2 [V] which is about a half of the voltage of the source line SL (for example, 0 [V] in FIG. 1) is applied to the word line WL2 connected only to the non-selected memories 3b (when the write inhibit gate voltage of the word line WL2 is set as WL2V, 0≤WL2V≤SLV/2). Thereby, in each of the memory transistors 2c and 2d which are the non-selected memories 3b connected to the word line WL2, when the voltage of 0 [V] is applied to the gate electrode G1, the channel is set in an off-state, so that the write source voltage of 4 [V] applied to the source region S1 is transmitted up to the extension region ET1 and held in the source region S1 and extension region ET1. Therefore, no current flows into the channel region CH1 and the high resistance region CH2, so that no charge is injected into the carrier storage region 5.

Further, in each of the non-selected memories 3b, when a write inhibit gate voltage of about a half of the voltage of the source line SL is applied to the word line WL2, the channel is set in an on-state, but the voltage supplied to the channel region CH1 and the high resistance region CH2 becomes a voltage obtained by subtracting a threshold value from the voltage applied to the word line WL2. Therefore, in each of the non-selected memories 3b, the electric field generated in the high resistance region CH2 becomes a half or less of the electric field applied in the selected memory 3a, and hence the generation amount of charges (carriers) is significantly reduced, so that charges are not injected into the carrier storage region 5.

In this way, in the non-volatile semiconductor memory device 1, since the electric field generated in the high resistance region CH2 of each of the non-selected memories 3b is reduced, charges are not injected into the carrier storage region 5 in each of the non-selected memories 3b, and only in desired selected memory 3a, charges in the drain region D1 can be injected into the carrier storage region 5 via the high resistance region CH2 by source side injection, so that data can be written.

(2-2) Data Writing Operation when Source Voltage is Set to 1.5 [V]

In "(2-1) data writing operation based on basic voltage setting", a case where the source voltage of 4 [V] is applied to the source line SL is described as an example. As in another example described below, the source voltage capable of causing source side injection can also be reduced in such a manner that the width of the side wall 7 of the memory transistors 2a, 2b, 2c and 2d is reduced, and that the length of the high resistance region CH2 under the side wall 7 is correspondingly reduced.

Figure 3:
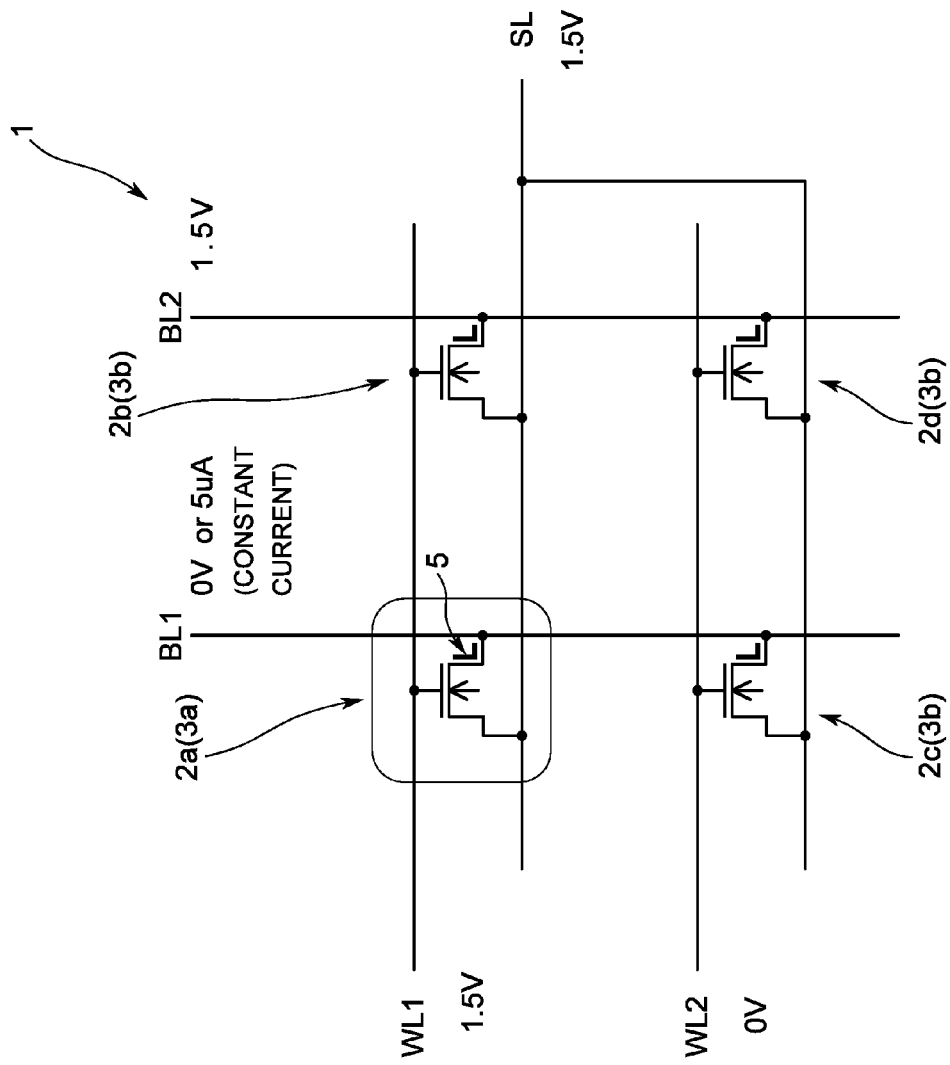
FIG. 3 is a circuit diagram showing voltage values of respective portions at the time of data writing when the source voltage is set to 1.5 [V]

For example, in the case where the length of the side wall of the transistor 2a is set to about 30 [nm], source side injection can be caused even when the source voltage applied to the source line SL is set to about 1.5 [V] as shown in FIG. 3 in which portions corresponding to the portions in FIG. 1 are denoted by the same reference numerals and characters. In this case, a voltage of 1.5 [V] to 2 [V] (a voltage of 1.5 [V] as an example in FIG. 3) may be applied to the word line WL1. Further, a voltage of 0.7 [V] to 1.5 [V] (a voltage of 1.5 [V] as an example in FIG. 3) may be applied to the bit line BL2 connected to the non-selected memory 3b (memory transistor 2b). Thereby, the potential difference between the bit line BL1 connected to the selected memory 3a and the bit line BL2 connected only to the non-selected memory 3b can be reduced to 1.5 [V] or less.

Further, a voltage of 0 [V] to 0.8 [V] (a voltage of 0 [V] as an example in FIG. 3) may be applied to the word line WL2 connected only to the non-selected memories 3b. Thereby, the potential difference between the word line WL1 connected to the selected memory 3a and the word line WL2 connected only to the non-selected memories 3b can be reduced to 1.5 [V] or less. Therefore, in this case, all the voltages required in the peripheral circuit, which controls the bit lines BL1 and BL2 and the word lines WL1 and WL2, can be configured by using voltages 1.5 [V] or less. As a result, the peripheral circuit can be configured by using an element, that is, a core MOS, which is configured by a thinnest insulating film (here, having a thickness of, for example, 3 [nm]) among gate insulating films used in elements of the same semiconductor integrated circuit, and thereby the circuit configuration can be further reduced in size. Further, in this case, the voltage applied between the gate electrode G1 and the substrate 6 of each of the memory transistors 2a, 2b, 2c and 2d is also reduced to 1.5 [V], and hence the film thickness of the gate insulating film 8a configuring each of the memory transistors 2a, 2b, 2c and 2d can be made equal to the film thickness of the gate insulating film of the core MOS. As a result, the memory transistors 2a, 2b, 2c and 2d can be formed by the same manufacturing process as the process used for the core MOS.

(3) Data Reading Operation

Figure 4:
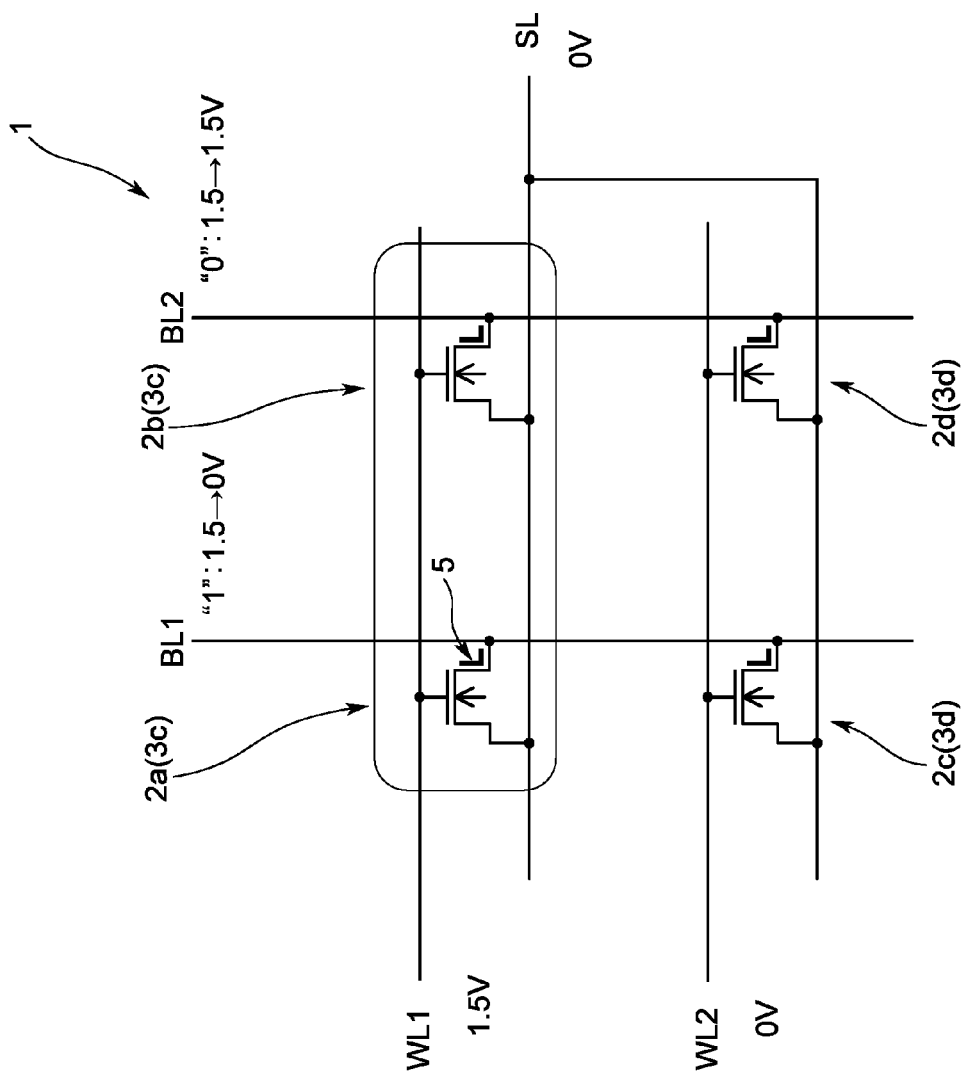
FIG. 4 is a circuit diagram showing voltage values of respective portions at the time of data reading.

Next, in the non-volatile semiconductor memory device 1, voltage application at the time of data reading will be described below. FIG. 4, in which portions respectively corresponding to the portions in FIG. 1 are denoted by the same reference characters, shows voltage values of respective portions at the time of reading data from the memory transistors 2a and 2b at the first row among the memory transistors 2a, 2b, 2c and 2d. It should be noted that, here, each of the memory transistors 2a and 2b, from which data is read, is referred to as a read memory 3c, and each of the memory transistors 2c and 2d, from which data is not read, is referred to as a non-read memory 3d. Further, in this case, it is assumed that data is written only in the memory transistor 2b among the memory transistors 2a, 2b, 2c and 2d, and that data is not written in the other memory transistors 2a, 2c, and 2d. Further, here, the state in which charges are accumulated in the carrier storage region 5 (when data is written) is set to, for example, "0", and the state in which no charge is accumulated in the carrier storage region 5 (when data is not written) is set to "1".

In this case, in the non-volatile semiconductor memory device 1, a read voltage of, for example, 1.5 [V] is applied to the bit lines BL1 and BL2 connected to the read memories 3c, to pre-charge the bit lines BL1 and BL2, and a voltage of 1.5 [V] is applied to the word line WL1 connected to the read memories 3c. On the basis of a change of the read voltage of the bit lines BL1 and BL2, the non-volatile semiconductor memory device 1 can determine the data written state in the read memory 3c.

For example, in the memory transistor 2b that is the read memory 3c in which charges are accumulated in the carrier storage region 5 (data is written), the current of the high resistance region CH2 is cut off by the charges accumulated in the carrier storage region 5, so that the high resistance region CH2 is set in a further high resistance state. As a result, even when the MOS of the memory transistor 2b, which is the read memory 3c with data written therein, is set in an on state, the memory transistor 2b is set in an off operation state in which current does not flow into the channel region CH1, or is set in a state in which the current flowing through the channel region CH1 is reduced.

Thereby, the read voltage of the bit line BL2 remains at 1.5 [V]. On the other hand, the memory transistor 2a, which is the other read memory 3c with no charge accumulated in the carrier storage region 5 (with no data written therein), is operated to be turned on. Thereby, the read voltage of the bit line BL1 is changed and set to have a voltage value (for example, 0 [V]) lower than 1.5 [V]. The non-volatile semiconductor memory device 1 detects such change in the read voltage of each of the bit lines BL1 and BL2, and determines read information by setting, to "0", the bit line BL2 whose read voltage remains to be 1.5 [V], and by setting, to "1", the other bit line BL1 whose read voltage is changed.

Here, when it is considered that each of the memory transistors 2a, 2b, 2c and 2d is configured by two regions of a switch region made of MOS and a high resistance region CH2, it can be said that each of the memory transistors 2a, 2b, 2c and 2d is a resistance change memory element in which the threshold value of the switch region is not changed, and each of which is used as a memory element by changing the resistance of the high resistance region CH2.

It should be noted that a voltage of 0 [V] is applied to the word line WL2 connected only to the non-read memories 3d. Thereby, in the non-volatile semiconductor memory device 1, each of the memory transistors 2c and 2d, which are the non-read memories 3d, is set in an off-state, and thereby the read voltage applied to the bit lines BL1 and BL2 are not changed by the non-read memories 3d so as to enable only the data of the read memory 3c to be read.

(4) Operation and Effect

In the above-described configuration, the memory transistor 2a is configured by a single layer gate structure in which the gate electrode G1 is provided on the substrate 6 via the gate insulating film 8a, and is configured such that the carrier storage region 5 is formed on the substrate 6 between the gate electrode G1 and the drain region D1 via the insulating layer 8b, and such that the high resistance region CH2 having a resistance value higher than the resistance value of the extension region ET1 is provided in the surface of the substrate 6, the surface facing the carrier storage region 5.

Thereby, in the selected memory 3a into which data is written, at the time of data writing, a write source voltage of, for example, 4 [V] is applied to the source region S1 from the source line SL, and a write gate voltage is applied to the gate electrode G1 from the word line WL1. Thereby, the selected memory 3a is set in a state in which current flows through the channel region CH1 and the high resistance region CH2. In this state, in the selected memory 3a, when a write voltage of, for example, 0 [V] is applied to the drain region D1 from the bit line BL1, or when constant current of 5 [µA] is supplied to the drain region D1, data can be written by so-called source side injection in which a voltage drop is caused in the high resistance region CH2, so as to generate a strong electric field, and in which charges are injected into the carrier storage region 5 by this strong electric field.

In this way, in the selected memory 3a, it is only necessary that, at the time of data writing, a voltage drop is caused in the high resistance region CH2. Accordingly, it is possible that, while the value of voltage applied to the gate electrode G1 is suppressed to be lower than the voltage value in the conventional device, the charges in the drain region D1 can be injected into the carrier storage region 5 via the high resistance region CH2.

On the other hand, in the memory transistor 2b that is the non-selected memory 3b to which the write gate voltage is applied via the word line WL1, when the write inhibit voltage of, for example, 4 [V] is applied to the drain region D1 from the bit line BL2, the channel can be set in an off state so as to suppress the flow of current in the channel region CH1, and hence the source side injection is not generated in the high resistance region CH2 so that data writing can be prevented.

Further, in the memory transistors 2c and 2d that are the non-selected memories 3b connected to the other word line WL2, when the write inhibit gate voltage of 0 [V] is applied to the gate electrode G1 from the word line WL2, the channel is set in an off-state so as to prevent the write source voltage of the source line SL from being transmitted from the source region S1. As a result, the source side injection is not generated, so that the writing of data into the carrier storage region 5 can be prevented.

In this way, in the non-volatile semiconductor memory device 1, the value of voltage applied to each of the gate electrode G1 and the drain region D1 can be reduced in each of the selected memory 3a in which data is written, and of the non-selected memory 3b in which data is not written. Therefore, the film thickness of the gate insulating film 8a of each of the memory transistors 2a, 2b, 2c and 2d can be reduced in correspondence with the reduction of the values of applied voltages.

Especially, in the non-volatile semiconductor memory device 1, at the time of data writing, as a voltage applied to each of the memory transistors 2a, 2b, 2c and 2d, a high voltage is applied to the common source line SL, so that the bit lines BL1 and BL2 can be controlled by a voltage equal to or less than the voltage of the source line SL, and hence the voltage of the peripheral transistor 11 for controlling the bit lines BL1 and BL2 can be reduced. As a result, the gate insulating film of the peripheral transistor 11 can also be formed to have a film thickness reduced in correspondence with the reduction of the voltage.

Further, in the non-volatile semiconductor memory device 1, at the time of data writing, the difference between the voltages respectively applied to the bit lines BL1 and BL2, and the word lines WL and WL2 can be suppressed to 4.5 [V] or less (1.5 [V] or less in FIG. 3), and hence the peripheral transistor 11 for controlling the bit lines BL1 and BL2, and the word lines WL1 and WL2 can be designed by using an input/output MOS and a core MOS. Therefore, in correspondence with the reduction in the film thickness of the gate insulating film 8a of the peripheral transistor 11, the operation speed of the peripheral transistor 11 can be increased, and the circuit area of the peripheral transistor 11 can also be reduced, as a result of which the size of the entire circuit can be reduced.

In this way, in the non-volatile semiconductor memory device 1, the thickness of the gate insulating film 8a of each of the memory transistors 2a, 2b, 2c and 2d, and the thickness of the gate insulating film 8a of the peripheral transistor 11 can be reduced, and hence a general MOS structure, such as an input/output MOS and a core MOS, can be used as it is. Therefore, the non-volatile semiconductor memory device 1 can be easily manufactured by a standard CMOS process.

Further, in the non-volatile semiconductor memory device 1, at the time of data writing, it is necessary to apply a write source voltage of 4 [V] to the source line SL, but the write source voltage is collectively applied to all the memory transistors 2a, 2b, 2c and 2d formed in the memory mat. Therefore, it is not necessary to divide the source line SL in the memory mat, and the source line SL can be formed to have the same circuit configuration as that of a usual NOR-type mask ROM.

With the configuration described above, when in the memory transistor 2a, the channel is set in an on-state at the time of data writing, a voltage drop is caused in the high resistance region CH2 between the channel region CH1 and the drain region D1 to generate a strong electric field, as a result of which, by source side injection using the strong electric field, charges in the drain region D1 can be injected into the carrier storage region 5 in the side wall 7 via the high resistance region CH. Thereby, in the non-volatile semiconductor memory device 1, since at the time of data writing, it is only necessary that a voltage drop is caused in the high resistance region CH2, the value of voltage applied to the gate electrode G1 can be reduced as compared with the conventional device. In correspondence with the reduction of the value of applied voltage, it is possible to reduce the film thickness of the gate insulating film 8a of the memory transistors 2a, 2b, 2c and 2d, and further the film thickness of the gate insulating film 8a of the peripheral transistor 11 for controlling the memory transistors 2a, 2b, 2c and 2d, as a result of which the size of the circuit configuration can be reduced as compared with the conventional device.

(5) Other Embodiments

Figure 5:
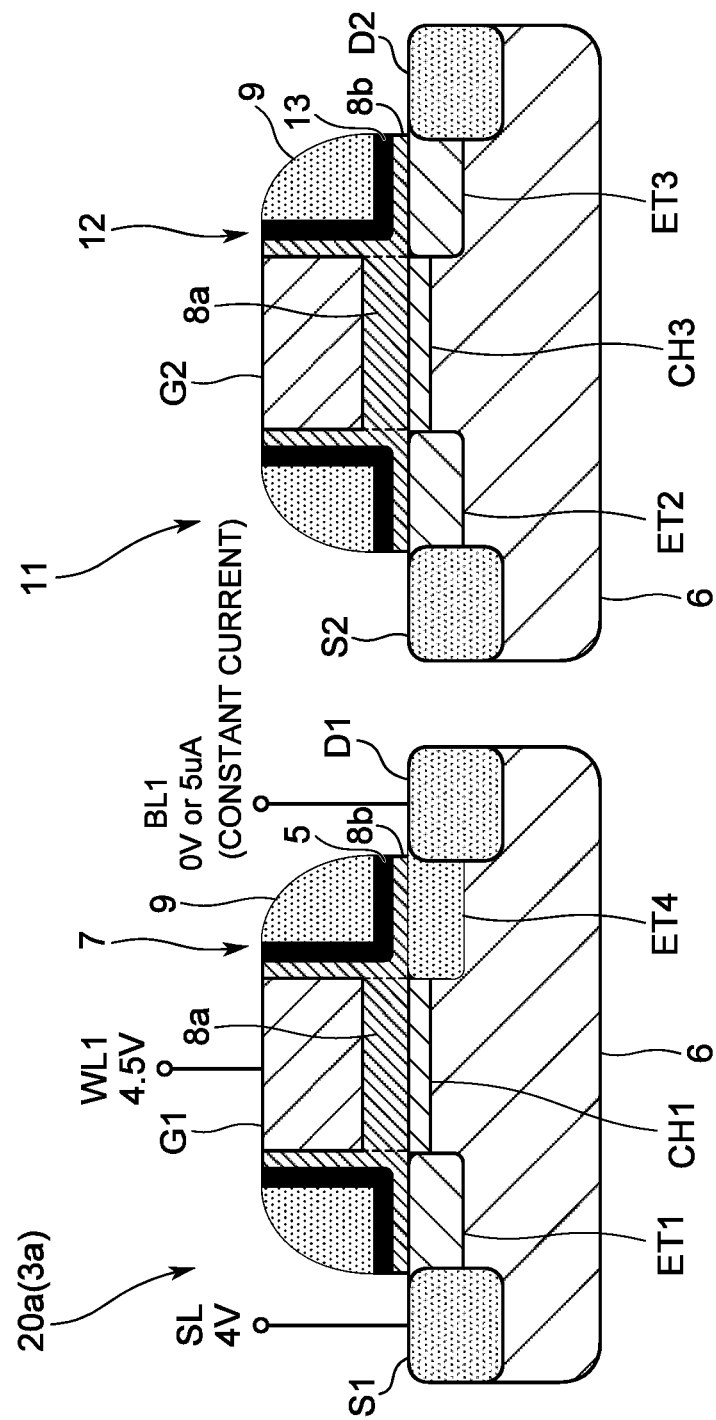
FIG. 5 is a sectional side view showing a cross-sectional structure of a memory transistor of another embodiment.

It should be noted that, in the above-described embodiment, a case is described in which the extension region ET1 is provided only on the side of the source region S1, and in which the high resistance region CH2 extending to a region under the gate electrode G1 is provided between the channel region CH1 and the drain region D1. However, the present invention is not limited to this, and as shown in FIG. 5 in which portions corresponding to the portions of FIG. 2 are denoted by the same reference numerals and characters, a lightly doped extension region ET4 may also be provided, as a high resistance region, on the side of the drain region D1 so as to be in contact with the side surface of the drain region D1.

In this case, in the memory transistor 2a, the impurity concentration of the lightly doped extension region ET4 formed in the region (the region between the channel region CH1 and the drain region D1) under one of the side walls 7 is selected to be lower than the impurity concentration of the extension region ET1 formed in the region (region between the channel region CH1 and the source region S1) under the other of the side walls 7, so that the lightly doped extension region ET4 has a resistance value higher than the resistance value of the extension region ET1 on the side of the source line SL. It should be noted that, in the case of this embodiment, the impurity doping amount of the lightly doped extension region ET4 as the high resistance region CH2 is preferably set to $1E18/cm^3$ or less.

In the memory transistor 2a configured in this way, at the time of data writing, similarly to the above-described embodiment, a largest voltage drop is caused in the lightly doped extension region ET4 having the high resistance value, by the potential difference caused between the source line SL and the bit line BL1, so that data can be written by the so-called source side injection in which charges are injected into the carrier storage region 5 by the strong electric field generated in the lightly doped extension region ET4.

It should be noted that, in FIG. 1 to FIG. 5, voltage values are respectively specified at the time of data writing and at the time of data reading. However, the present invention is not limited to this, and various voltage values may be applied. For example, in the above-described embodiment shown in FIG. 1, a case is described in which the voltages of 4.5 [V] and 4 [V] are respectively applied to the word line WL1, and the bit line BL2 connected only to the non-selected memory 3b so as to prevent data from being written in the non-selected memory 3b. However, as described above, a voltage of 2 [V] may be applied to each of the word line WL1, and the bit line BL2 connected only to the non-selected memory 3b so as to prevent data from being written in the non-selected memory 3b. In this case, the non-selected memory is set in the on-state, so that current flows through the channel. However, the electric field applied to the high resistance region CH2 of the non-selected memory becomes about a half of the electric field applied to the high resistance region CH2 of the selected memory 3a, and hence the source side injection is not caused in this case.

Further, a case is described in which a voltage of 0 [V] is applied to the word line WL2. However, as described above, a voltage of a half of the voltage applied to the source line SL, that is, a voltage of 2 [V] may be applied to the word line WL2, so as to prevent data from being written into the non-selected memory 3b connected to the non-selected word line WL2. Also, in this case, the non-selected memory 3b is set in an on-state so that current flows through the channel. However, the electric field applied to the high resistance region CH2 of the non-selected memory 3b becomes about a half of the electric field applied to the high resistance region CH2 of the selected memory 3a, and hence the source side injection is not caused in this case.

In this way, at the time of data writing, even in the case where a voltage of about a half of the voltage 4 [V] applied to the source line SL, that is, a voltage of 2 [V] is applied to the word line WL2 and the bit line BL2, it is possible to reduce the value of voltage applied to the gate electrode G1 as compared with the conventional device. In this case, the potential difference between the bit line BL1 connected to the selected memory 3a and the bit line BL2 connected only to the non-selected memory 3b becomes 2 [V], and further the potential difference between the word line WL1 connected to the selected memory 3a and the word line WL2 connected only to the non-selected memory 3b also becomes 2 [V]. As a result, both of the potential differences can be suppressed to be low.

Therefore, in correspondence with the reduction in the potential differences, the film thickness of the gate insulating film 8a of the memory transistors 2a, 2b, 2c and 2d, and the film thickness of the gate insulating film 8a of the peripheral transistor 11 for controlling the memory transistors 2a, 2b, 2c and 2d can be designed to be reduced from 8 [nm] to 3 [nm], and thereby the peripheral transistor 11 can be changed from an input/output MOS to a core MOS, so that the size of the circuit configuration can be reduced as compared with the conventional device.

Specifically, when the source voltage is set to 4 [V], and when the operation voltage of the MOS transistors used as the peripheral circuit is set to 4 to 4.5 [V], an input/output MOS can be used as an MOS used in the peripheral circuit. Further, when the source voltage is set to 1.5 [V], and when the operation voltage of the MOS transistors used as the peripheral circuit is set to 1.5 [V], a core MOS can be used as an MOS used in the peripheral circuit. Further, when the source voltage is set to 4 [V], and when the operation voltage of the MOS transistors used as the peripheral circuit is set to 2 [V], a core MOS can be used as the peripheral transistor 11.

Further, in the above-described embodiment, a case is described in which, at the time of data writing, charges in the drain region D1 are injected into the carrier storage region 5 in the side wall 7 via the high resistance region CH2. However, the present invention is not limited to this, and the entire side wall may be formed of silicon oxide to allow the side wall itself to function as a carrier storage region, so that, at the time of data writing, charges in the drain region D1 are injected into the side wall via the high resistance region CH2.

Further, it is not necessary that the side wall structure of the memory transistors 2a, 2b, 2c and 2d is the same as the side wall structure of the peripheral transistor 11. For example, the side wall 12 of the peripheral transistor 11 may be formed to have a single layer oxide film structure in which the nitride film layer 13 is not provided and in which the entire side wall 12 is formed by a silicon oxide film. Further, in each of the memory transistors 2a, 2b, 2c and 2d, it is not necessary that the side wall 7 is separately formed at the side portion of the gate electrode G1. A silicon oxide layer or a nitride layer, which is arranged on the substrate 6 between the gate electrode G1 and the drain region D1 but is not formed as a side wall, may also be made to function as the carrier storage region.

It should be noted that, in the above-described embodiment, a non-volatile semiconductor memory device 1 is described, in which memory transistors 2a, 2b, 2c and 2d are arranged in two rows and two columns. However, the present invention is not limited to this, and the present invention may be applied to a non-volatile semiconductor memory device in which the other plurality of, such as three to five, six, or more memory transistors are arranged in a matrix form, and may be applied to a non-volatile semiconductor memory device in which one memory transistor is arranged.

Further, a case is described in which the memory transistors 2a, 2b, 2c and 2d, and the peripheral transistor 11 are formed to have an N-type MOS structure. However, the present invention is not limited to this, and the memory transistors 2a, 2b, 2c and 2d, and the peripheral transistor 11 are formed to have a P-type MOS structure. Even in this case, at the time of data writing, a voltage drop is caused in the high resistance region CH2, so that charges (holes) in the drain region D1 can be injected, by source side injection, into the carrier storage region 5 via the high resistance region CH2.

What is claimed is:

1. A non-volatile semiconductor memory device including one or more memory transistors each having a single layer gate structure in which a gate electrode is provided on a substrate via a gate insulating film, wherein
the memory transistor comprises:
a drain region formed in a surface of the substrate and connected to a bit line to which a write voltage is applied;
a source region formed in the surface of the substrate and connected to a source line to which a write source voltage higher than the write voltage applied to the drain region via the bit line is applied;
a carrier storage region provided on the substrate and arranged between the gate electrode and the drain region;
a channel region formed under the gate electrode, in which current flows by applying the write source voltage higher than the write voltage applied to the drain region to the source region via the source line and applying a write gate voltage to the gate electrode via a word line; and
a high resistance region formed in a region in the surface of the substrate being in contact with the drain region connected to the bit line to which the write voltage lower than the write source voltage applied to the source region is applied, facing the carrier storage region, and having a resistance value higher than a resistance value of a region between the source region and the channel region under the gate electrode;
wherein when current flows in the channel region by applying the write gate voltage to the gate electrode while applying the write source voltage higher than the write voltage applied to the drain region to the source region, current flows in the high resistance region as well, and a strong electric field is generated in the high resistance region due to a large voltage difference with respect to the drain region, thereby accelerating carriers in the drain region to be injected into the carrier storage region.

2. The non-volatile semiconductor memory device according to claim 1, wherein
in the substrate, an extension region is formed in contact with the source region, and the high resistance region is formed to have an impurity concentration lower than the impurity concentration of the extension region.

3. The non-volatile semiconductor memory device according to claim 1, wherein the high resistance region is formed in a region ranging from the drain region to a part of the channel region.

4. The non-volatile semiconductor memory device according to claim 1, wherein a read voltage is applied to a bit line connected to the drain region, and whether or not carriers are injected into the carrier storage region is determined from a change of the read voltage at a time when the channel is formed by applying a voltage to the gate electrode.

5. The non-volatile semiconductor memory device according to claim 1, wherein a film thickness of the gate insulating film of the memory transistor is selected to be equal to a smallest film thickness of the gate insulating film among peripheral transistors for controlling the memory transistor.

6. A non-volatile semiconductor memory device, comprising:
at least one memory transistor comprising
a drain region formed in a surface of a substrate and connected to a bit line to which a write voltage is applied,
a source region formed in the surface of the substrate and connected to a source line to which a write source voltage higher than the write voltage is applied,
a carrier storage region provided on the substrate and arranged between a gate electrode and the drain region,
a channel region formed under the gate electrode and in which current flows by applying the write source voltage to the source region via the source line and by applying a write gate voltage to the gate electrode via a word line, and
a high resistance region formed in the surface of the substrate so as to be in contact with the drain region and so as to face the carrier storage region, where the high resistance region has a resistance value higher than a resistance value of a region between the source region and the channel region under the gate electrode;

wherein (a) current flows in the high resistance region when current flows in the channel region, and (b) a strong electric field is generated in the high resistance region due to a large voltage difference with respect to the drain region, thereby accelerating carriers in the drain region to be injected into the carrier storage region.

* * * * *